United States Patent [19]
Hatano

[11] Patent Number: 5,119,158
[45] Date of Patent: Jun. 2, 1992

[54] GATE ARRAY SEMICONDUCTOR INTEGRATED CIRCUIT DEVICE

[75] Inventor: Tsutomu Hatano, Tokyo, Japan

[73] Assignee: NEC Corporation, Tokyo, Japan

[21] Appl. No.: 615,888

[22] Filed: Nov. 20, 1990

[30] Foreign Application Priority Data
Nov. 21, 1989 [JP] Japan ................................. 1-304055

[51] Int. Cl.⁵ ............................................. H01L 27/02
[52] U.S. Cl. ........................................ 357/40; 357/45; 357/41; 364/491
[58] Field of Search ............................ 357/40, 41, 45; 364/491

[56] References Cited

U.S. PATENT DOCUMENTS

| | | | |
|---|---|---|---|
| 4,688,070 | 8/1987 | Shiotari et al. | 357/40 |
| 4,833,620 | 5/1989 | Takahashi | 357/40 X |
| 4,839,820 | 6/1989 | Kinoshita et al. | 357/40 X |
| 4,887,135 | 12/1989 | Cheney et al. | 357/45 X |
| 4,959,704 | 9/1990 | Isomura et al. | 357/41 X |

Primary Examiner—William Mintel
Assistant Examiner—Roy Potter
Attorney, Agent, or Firm—Laff, Whitesel, Conte & Saret

[57] ABSTRACT

A set of input and output buffers are arranged in an outer peripheral portion of a semiconductor chip and a macro region and a set of internal gates are arranged in an inside portion of the semiconductor chip. The input and output buffers are connected to the internal gates through a boarder region between the macro and the set of the internal gates.

9 Claims, 4 Drawing Sheets

GATE ARRAY SEMICONDUCTOR INTEGRATED CIRCUIT DEVICE

BACKGROUND OF THE INVENTION

The present invention relates to a gate array semiconductor integrated circuit (IC) device.

A gate array IC device, in which bonding pads and input/output buffer regions are arranged in peripheral portions of a semiconductor chip and a macrocell region and an internal gate region are arranged in central portions of the semiconductor chip, is called as a composite type gate array semiconductor IC device.

A gate array device is realized in general by preparing a suitably impurity-diffused master wafer and customizing various functions thereof by a wiring step. In such a wiring step, a computer aided design (CAD) technique is used to design a desired wiring pattern.

In the macrocell region, a plurality of macro cells such as memory cells are formed, and set internal wirings previously designed and registered are formed so as to realize a previously determined memory and/or logic function. When the function of the macro cells is to be realized by using internal gates, an area therefor is increased with performance degraded. Therefore, such a macrocell region is designed at high density and disposed in a specific region of the chip by the registered wiring pattern.

In the internal gate region, a plurality of internal gates are formed, and function blocks (FBs) such as flip-flop are realized by combining the internal gates using a specific or personal wiring pattern by an automatic wiring design technique of CAD to satisfy the requirement of the customer.

In the input/output buffer regions, a plurality of input/output buffers are arranged, and the input/output buffers have functions such as level shift and external load which are different from the functions in the internal gate region. Therefore, the input/output buffer regions are excluded from the scope of the automatic wiring by CVD.

On a conventional composite type gate array semiconductor IC device, wiring channel regions are provided between the macrocell region and the input/output buffer regions and/or between one macrocell region and another macrocell region so as to only form thereon wirings for connecting the internal gate region and the input/output buffer region. Under the wiring channel regions, any circuit element constituting the macrocell or the input/output buffer is not formed and any internal wiring belonging within the macrocell region or the input/output buffer region is not formed. When the area of the wiring channel region is too small, the automatic wiring design by CAD technique becomes impossible. Alternately, when such a region is too large, the effective area ratio to the total area of the semiconductor chip of the device is decreased, and therefore, for example, the number of internal gates may be reduced.

SUMMARY OF THE INVENTION

An object of the present invention is to provide a gate array semiconductor integrated circuit device having improved effective area ratio to the total area of the semiconductor chip by omitting the wiring channel region mentioned above.

According to the present invention, there is provided a gate array semiconductor integrated circuit device comprising a semiconductor chip having a quadrilateral plan shape encircled by first, second, third and fourth straight edge lines; a first input/output buffer region formed on the semiconductor chip and along the first straight edge line and constituted by an input/output buffer set; a second input/output buffer region formed on the semiconductor chip and along the second straight edge line, the second input/output buffer region including first and second sections each constituted by an input/output buffer set; a third input/output buffer region formed on the semiconductor chip and along the third straight edge edge line and constituted by an input/output buffer set; a fourth input/output buffer region formed on the semiconductor chip and along the fourth straight edge line, the fourth input/output buffer region including first and second sections each constituted by an input/output buffer set; a macrocell region formed on the semiconductor chip and attached to the first input/output buffer region and to the first sections of the second and fourth input/output buffer regions; an internal gate region formed on the semiconductor chip and attached to the third input/output buffer region, to the second sections of the second and fourth input/output buffer regions, and to the macrocell region with a boundary line therebetween; and wiring layers connecting the internal gate region to the first input/output buffer region and/or to the first sections of the second and/or fourth input/output buffer regions, all of the wiring layers being formed through the boundary line and formed over the macrocell region, and the wiring layers being isolated from the macrocell region.

Thus, only the internal gates are arranged in a region to which an automatic wiring by CAD technique is applicable. The input and output buffer regions and the macrocell region are excluded from the automatic wiring region. There is no need of providing a wiring channel region for connecting the input and output buffers to the internal gates, resulting in an improvement of effective area rate of a semiconductor chip.

BRIEF DESCRIPTION OF DRAWING

The above and other objects, features and advantages of this invention will become more apparent by reference to the following detailed description of the invention taken in conjunction with the accompanying drawings wherein.

DETAILED DESCRIPTION OF THE EMBODIMENT

Figure 1:
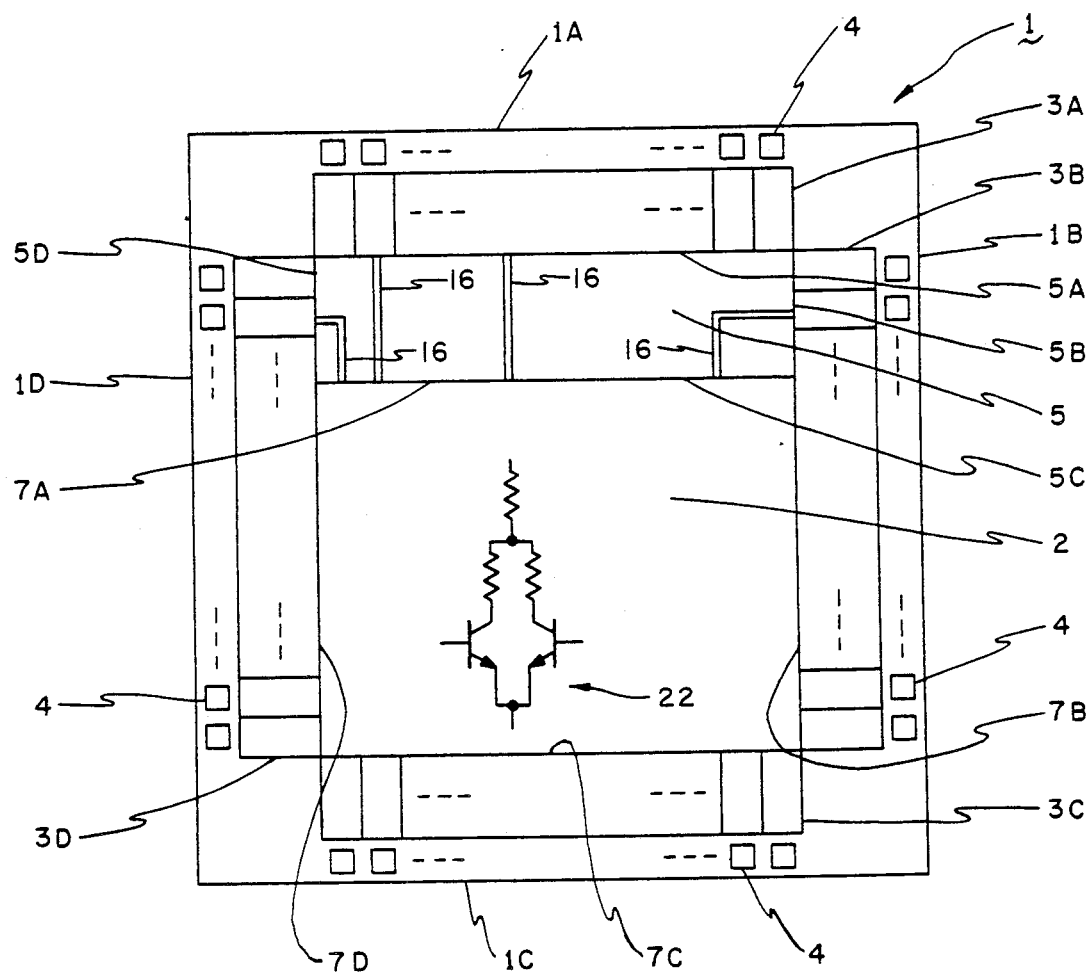
FIG. 1 is a plan view of a semiconductor chip according to an embodiment of the present invention.

Referring to FIG. 1, a plurality of bonding pads 4 are arranged in an outer peripheral portion of a surface of a square or rectangular semiconductor chip 1 having four straight side edge lines 1A, 1B, 1C and 1D. A set of input and output buffers 3A is arranged inside those among the bonding pads 4 arranged along the side edge line 1A of the chip 1 and sets of input and output buffers 3B, 3C and 3D are similarly arranged inside the bonding pads 4 along the side edge lines 1B, 1C and 1D, respectively. In an inner region of the chip 1 surrounded by the input and output buffer sets 3A, 3B, 3C and 3D, a macrocell region 5 such as memory region and internal gate region 2 are arranged. In the internal gate region 2, a plurality of internal gates 22 or basic cells 22 are formed (in FIG. 1, only one is represented). The macrocell region 5 is formed within a rectangular section of the inner region with one of longer sides 5A of the macrocell region 5 being adjacent to the input and output buffer set 3A and the other side 5C being adjacent to the internal gate region 2. The shorter sides 5B and 5D of the macrocell region 5 are adjacent to the sections of the sets 3B and 3D of the input and output buffers, respectively. There is no wiring channel region for connection between the input and output buffer set 3A and the internal gate region 2, and the connection is performed by an uppermost wiring layer 16 (for example, the third aluminum layer) with connecting points of the internal gate set 2 defined in a boarder portion 5C (7A) between the macrocell region 5 and the internal gate region 2. Connections between all of the input and output buffers of the set 3C and input and output buffers of the sets 3B and 3D which are not adjacent to the short sides 5B and 5D of the macrocell region 5 and the internal gate set 2 are also performed by defining connecting points in border regions 7C, 7B and 7D. Input and output terminals (not shown) of the macrocell region 5 are collected in the side of the internal gate region 2, i.e., in the longer side 5C thereof, and connected to the input and output terminals (not shown) of the internal gate region 2.

In the conventional composite type gate array semiconductor integrated circuit device, regions other than the input and output buffer region are used for CAD automatic wiring regions. On the contrary, in the present invention, only the internal gate region 2 is used for automatic wiring region. That is, in the present invention, an area of the automatic wiring region is much reduced compared with that of the conventional device in which wiring channel regions are provided around the macrocell region as an automatic wiring region, so that the effective area rate of the semiconductor chip 1 is much improved. Further, since the automatic wiring is used for only the internal gate region 2 in the rectangular region, it is possible to use CAD technique similar to that used in a conventional gate array which is not composite type. Since such technique has been established, improvements of wiring and effective number of gates can be expected.

A concrete example of the embodiment mentioned above will be described with reference to FIGS. 2 to 5.

Figure 2:
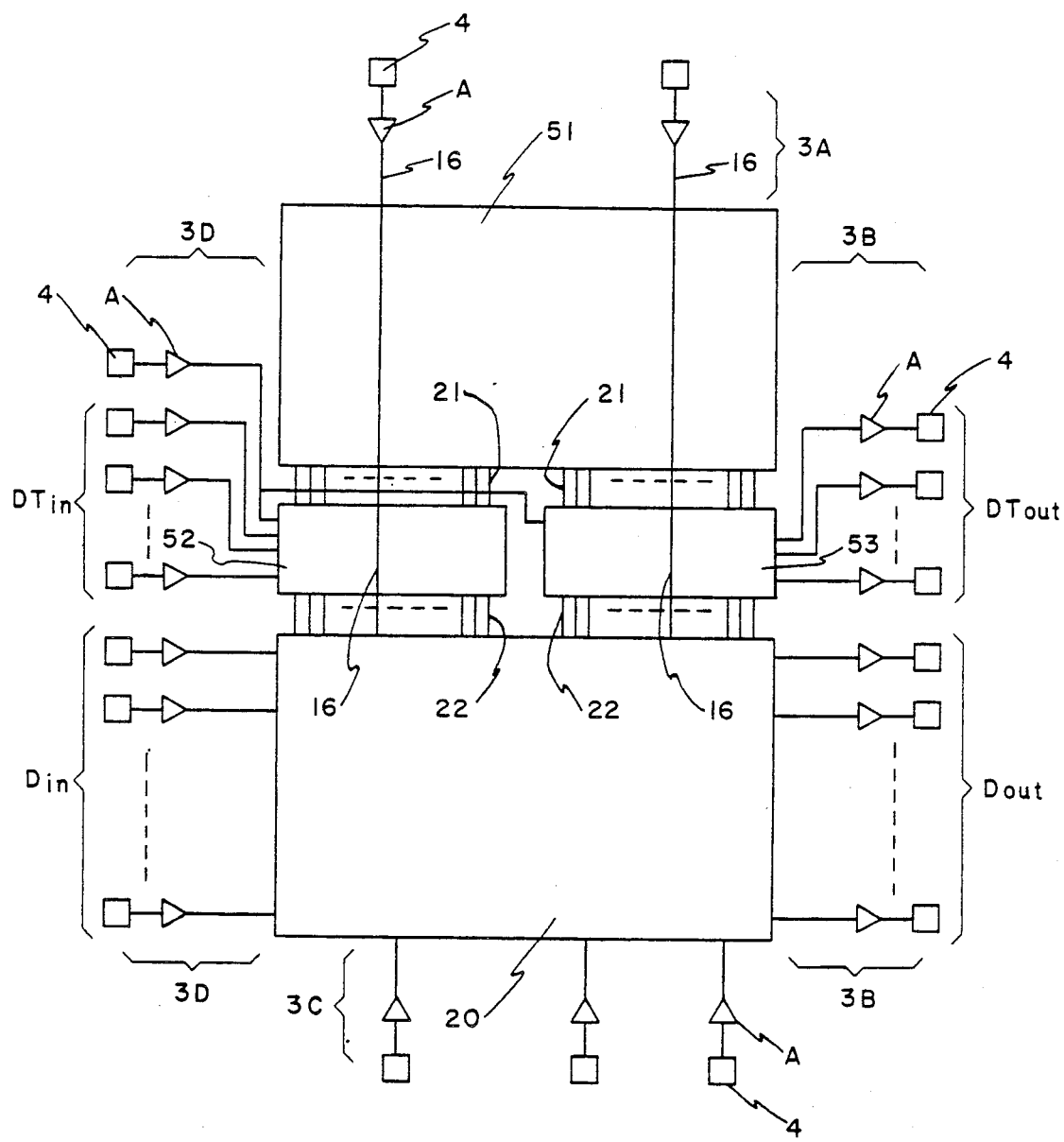
FIG. 2 is a block circuit diagram showing an example of a semiconductor integrated circuit fabricated according to the embodiment of the present invention.

In FIG. 2, the system includes a memory 51, an input selection circuit 52, an output selection circuit 53 and a logic circuit 20. The memory 51 and the input and output selection circuits 52, 53 constitute a macro and are formed in the macrocell region 5 (FIG. 1), and the logic circuit 20 is constituted, for example, by internal gates 22 and formed in the internal gate region 2 (FIG. 1).

Figure 3:
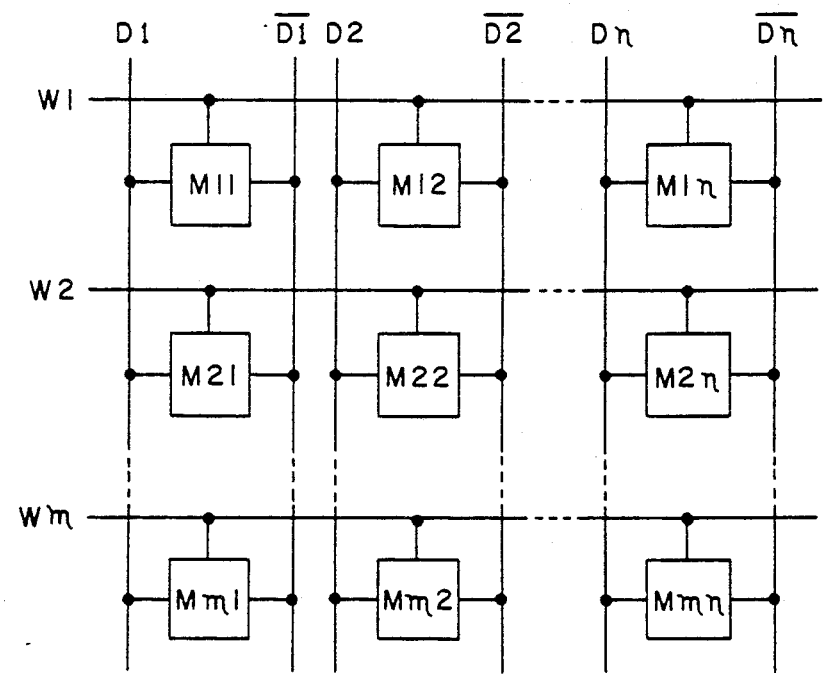
FIG. 3 is a block circuit diagram showing the memory cell array portion of CMOS SRAM shown in FIG. 2.

The memory 51 (FIG. 2) comprises a CMOS SRAM and includes a memory cell array shown in FIG. 3 and peripheral circuits which are not shown. The input selection circuit 52 (FIG. 2) selects either an output signal of the logic circuit 20 or a test input signal supplied to a terminal DTin and sends it to the memory 51 as an address input signal or an input data signal. The output selection circuit 53 sends an output data signal of the memory 51 to either the logic circuit 20 or a terminal DTout. A terminal (bonding pad) 4 is connected through a buffer amplifier A to the input selection circuit 52 and to the output selection circuit 53. These selections are performed by a test mode setting signal given as a potential at the terminal 4. The memory 51 is arranged along the longer side 5A (FIG. 1) of the macrocell region 5 adjacent to the input and output buffer set 3A. The logic circuit 20 is formed of the internal gate set 2 in FIG. 1 and arranged in a vicinity of the input and output buffers 3C. The input selection circuit 52 and the output selection circuit 53 are disposed in the macrocell region 5 between the memory 51 and the other longer side 5C. Wirings 16 connecting the logic circuit 20 and the amplifiers A as the input/output buffers 3A are provided above the input selection circuit 52 or the output selection circuit 53 and the memory 51, i.e., above the macrocell region 5.

The input terminals Din are connected to the connecting points (not shown) of the logic circuit 20 therein. The output terminals Dout are connected to the connecting points (not shown) of the logic circuit 20. In FIG. 2, the input and output selection circuits 52, 53 and the memory 51 are connected by wirings 21 in the macro, and the input and output selection circuits 52, 53 of the macro and the logic circuit 20 as an internal gate region is connected by wirings 22.

The memory 51 includes the memory cell array shown in FIG. 3. In this memory cell array, cross points between word lines Wi (i = 1, 2, ..., m) and digital line pairs Dj, $\overline{Dj}$ (j = 1, 2, ..., n) are connected to memory cells Mij.

Figure 4:
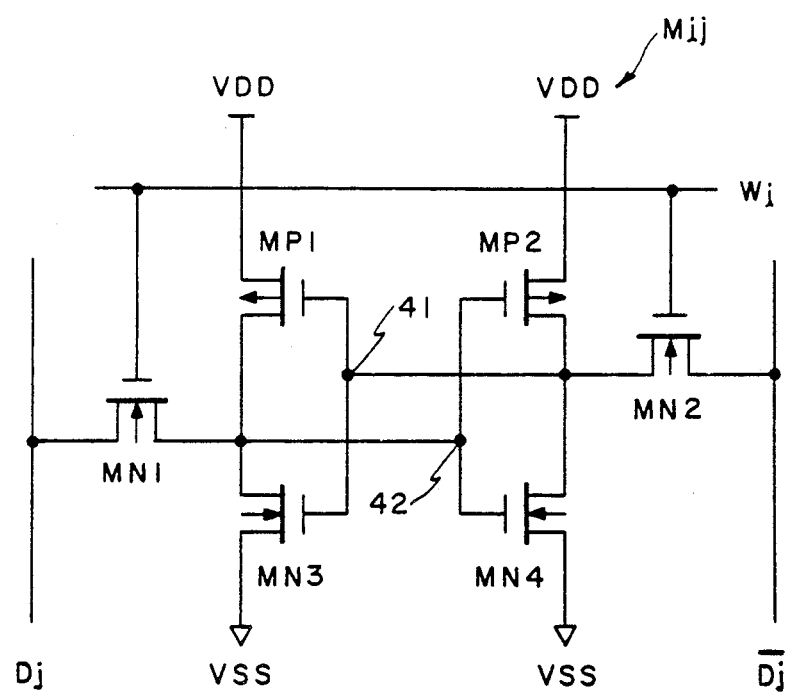
FIG. 4 is a circuit diagram of the memory cell array portion in FIG. 3.

In FIG. 4, each memory cell Mij includes a CMOS inverter composed of a pMOS transistor MP1 and an nMOS transistor MN3 and an CMOS inverter composed of a pMOS transistor MP2 and an nMOS transistor MN4. An input node and an output node of one of these two CMOS inverters are connected to an output node and an input node of the other, respectively, to constitute an input node 41 and an output node 42 of a flip-flop circuit. The nMOS transistor MN1 is a transfer transistor inserted into between the digit line Dj and the node 42 of the flip-flop and the nMOS transistor MN2 is a transfer transistor inserted into between the digit line $\overline{Dj}$ and the node 41 of the flip-flop circuit. Gate electrodes of these two transfer transistors MN1, MN2 are connected to the word line Wi. In FIG. 4, VDD and VSS are power source terminals and ground terminals of the CMOS inverters, respectively.

Assuming that the word line Wi becomes high level, the digit line Dj becomes high level and the digit line $\overline{Dj}$ becomes low level, the transfer transistors MN1 and MN2 are turned on, so that gate electrodes of the pMOS transistor MP1 and the nMOS transistor MN3 become low level and gate electrodes of the pMOS transistor MP2 and the nMOS transistor MN4 become high level. Thus, the nMOS transistor MN4 and the pMOS transistor MP2 are turned on and off, respectively, and the nMOS transistor MN3 and the pMOS transistor MP1 are turned off and on, respectively. Therefore, the node 41 of the flip-flop becomes a VSS level and the other node 42 becomes a VDD level. This condition is kept maintained even when the word line Wi becomes low level and the nMOS transistors MN1 and MN2 are turned off.

In order to read an information from this memory cell, the digit lines Dj and $\overline{Dj}$ are precharged to predetermined potential. The word line Wi becomes high level and the nMOS transistors MN1 and MN2 are turned on, so that the memory cell is connected to the digit lines. When either the nMOS transistor MN3 or the nMOS transistor MN4, for example, the latter is turned on, the potential of the digit line $\overline{Dj}$ drops while that of the digit line Dj is unchanged.

Figure 5:
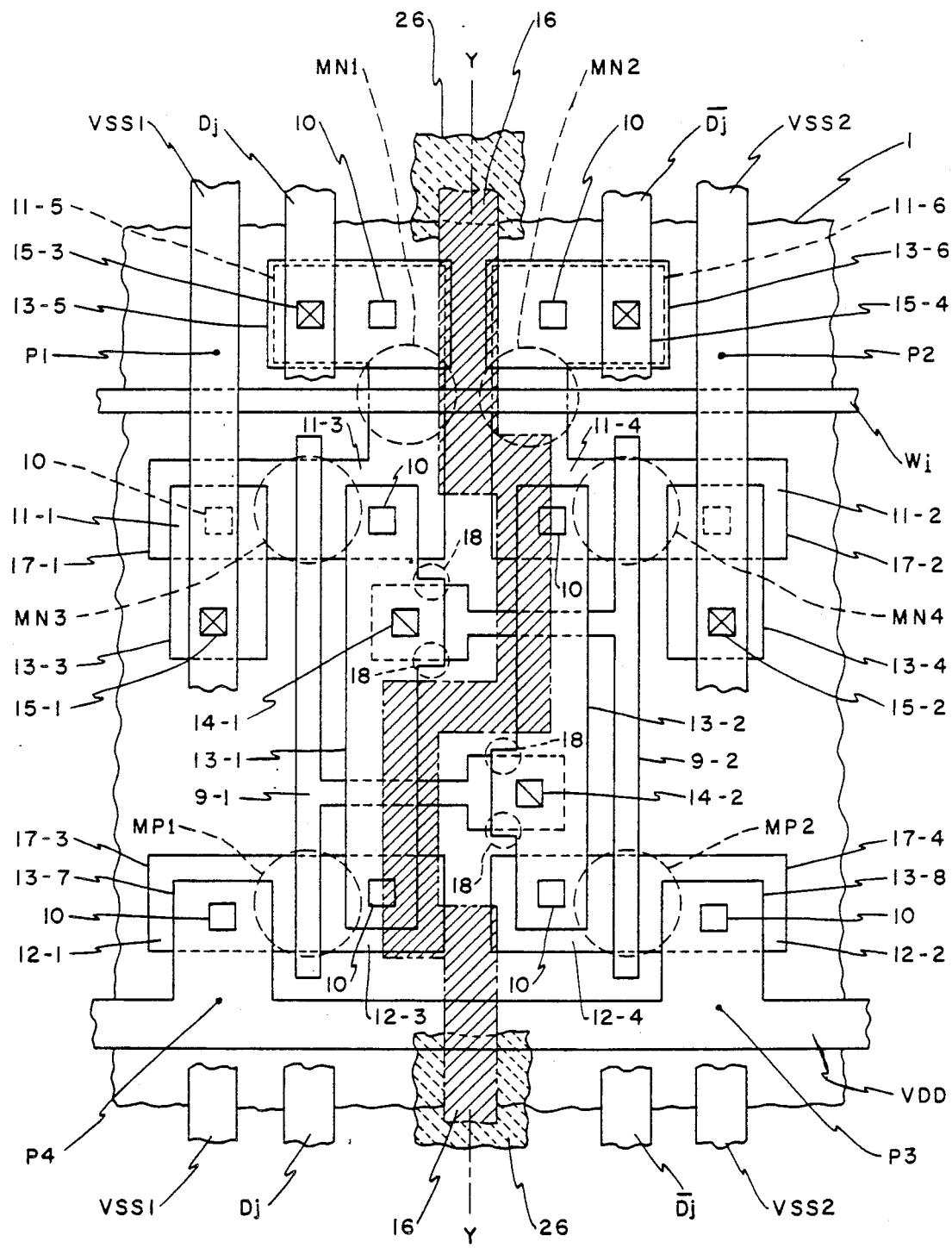
FIG. 5 is a plan view showing a device layout and a wiring pattern of the memory cell in FIG. 4.

FIG. 5 shows a memory device layout and wiring pattern of such memory cell when formed on a semiconductor chip. In FIG. 5, each memory cell is provided in a rectangular region having four sides defined by straight lines (not shown) connecting from a point P1 through points P2 and P3 to a point P4.

Element regions 17-1, 17-2, 17-3 and 17-4 are sectioned by field insulating films selectively formed on a surface of a monocrystalline silicon substrate. A gate oxide film 150 Å thick is formed on the monocrystalline silicon substrate surface in each of the element region.

Each of the element regions 17-1 and 17-2 includes a stripe region extending in parallel with a center line Y—Y and a stripe region extending perpendicularly thereto. Further, these regions 17-1 and 17-2 are arranged symmetrically with respect to the center line Y—Y and formed in P wells (not shown). The element regions 17-3 and 17-4 are stripe regions perpendicular to the center line Y—Y and formed in N wells (not shown). The word line Wi is formed as a polysilicon film having thickness of 0.8 μm and width of 0.8 μm and extends in a direction perpendicular to the center line Y—Y over across the stripe region parallel with the center line Y—Y. The word line Wi also serves as the gate electrodes of the nMOS transistors MN1 and MN2. A polycrystal silicon film 9-1 having thickness of 0.8 μm and width of 0.8 μm has a vertical main portion extending over a lower stripe region of the element region 17-1 perpendicular to the center line Y—Y and the element region 17-3 and a branch portion extending perpendicularly from the vertical main portion. The vertical main portion of the poly silicon film 9-1 serves as the gate electrodes of the nMOS transistor MN3 and the pMOS transistor MP1 and the branch portion becomes as the node 41 (FIG. 4) of the flip-flop. Similarly, a poly silicon film 9-2 includes a vertical main portion extending over a lower stripe region of the element region 17-2 perpendicular to the center line Y—Y and the element region 17-4 and a branch portion extending perpendicularly from the vertical main portion. The vertical main potion of the poly silicon film 9-2 serves as the gate electrodes of the nMOS transistor MN4 and the pMOS transistor MP2 and the branch portion becomes as the node 42 (FIG. 4) of the flip-flop. In portions of the element regions 17-1 and 17-2 which are not covered by the word line Wi and the poly silicon films 9-1 and 9-2, N+ diffusion layers 11-1, 11-2, 11-3, 11-4, 11-5 and 11-6 are formed. The N+ diffusion layers 11-5 and 11-3 are used as source and drain regions of the nMOS transistor MN1 and the N+ diffusion layers 11-6 and 11-4 are used as source and drain regions of the nMOS transistor MN2. The N+ diffusion layers 11-1 and 11-3 are used as a source region and a drain region of the nMOS transistor MN3, respectively. The nMOS transistor MN4 has the N+ diffusion layers 11-2 and 11-4 as its source and drain regions, respectively. In portions of the element region 17-3 which are not covered by the poly silicon film 9-1, P+ diffusion layers 12-1 and 12-3 are formed. The P+ diffusion layers 12-1 and 12-3 are source and drain regions of the pMOS transistor MP1. Similarly, in portions of the element region 17-4 which are not covered by the poly silicon film 9-2, P+ diffusion layers 12-2 and 12-4 are formed. These diffusion layers are used as source and drain regions of the pMOS transistor MP2, respectively.

Lines represented by numerals 13-1, 13-2, 13-3, 13-4, 13-5, 13-6, 13-7 and 13-8 and the power source lines VDD are made of first level metal wiring layer of such as first level aluminum film which are connected to the diffusion layers through contact holes 10. The line 13-1 of the first level metal wiring layer is connected to the N+ diffusion layer 11-3 and the P+ diffusion layer 12-3 and, through a contact hole 14-1 to the branch portion of the poly silicon film 9-2. The first level metal wiring 13-1, except its contact portion to the poly silicon film 9-2, takes in the rectangular form extending in parallel with the center line Y—Y. Similarly, the line 13-2 of the first level metal wiring layer is connected to the N diffusion layer 11-4 and the P diffusion layer 12-4 and, through a contact hole 14-2 to the branch portion of the poly silicon film 9-1. The first level metal wiring layer 13-2, except its contact portion to the poly silicon film 9-1, takes in the rectangular form extending in parallel with the center line Y—Y. The rectangular portions of the first level metal wirings 13-1 and 13-2 are arranged symmetrically with respect to the center line Y—Y. The first level metal wiring layer 13-3 takes in the form of a rectangular metal layer having a portion in contact with the N+ diffusion layer 11-1 and extends in parallel with the center line Y—Y above the field insulating film shown in a lower portion of this figure. Similarly, the first level metal wiring layer 13-4 takes in the form of a rectangular metal layer having a portion in contact with the N difference layer 11-2 and extends in parallel with the center line Y—Y above the field insulating film shown in a lower portion of this figure. The first level metal wiring layer 13-5 is a rectangular metal film covering a main portion of the N+ diffusion layer 11-5 and extending perpendicularly to the center line Y—Y. Similarly, the first level metal wiring layer 13-6 is a rectangular metal film covering a main portion of the N+ diffusion layer 11-6 and extending perpendicularly to the center line Y—Y. The first level metal wiring layer 13-7 is a metal film which has a portion in contact with the P+ diffusion layer 17-3 and extends in parallel with the center line Y—Y over the lower field oxide film and is connected to the power source line VDD. Similarly, the first level metal wiring layer 13-8 is a metal film which has a portion in contact with the P+ diffusion layer and extends in parallel with the center line Y—Y over the lower field oxide film and is connected to the power source line VDD. The power source line VDD is a first level metal wiring layer extending near the element regions 17-3 and 17-4 perpendicularly to the center line Y—Y.

The ground line VSS1 is a second level metal wiring layer of such as aluminum of second level which is connected through a contact hole 15-1 to the first layer metal wiring 13-3 provided in parallel with the center line Y—Y. Similarly, the ground line VSS2 is a second level metal wiring layer of such as aluminum of second level which is connected through a contact hole 15-2 to the first level metal wiring layer 13-4 provided in parallel with the center line Y—Y. The digit lines Dj and $\overline{Dj}$ are second level metal wirings of such as aluminum of second level which are arranged in parallel with each other and in symmetry with the center line Y—Y and connected through contact holes 15-3 and 15-4 to the first level metal wiring layers 13-5 and 13-6, respectively.

In the above description of the construction of memory cell, wirings for applying predetermined voltages to the P and N wells are omitted to show. Further, it should be noted that there are insulating films between the diffusion layers and the first level metal wiring layer, between the poly silicon layer and the first level metal wiring layer and between the first and second level metal wiring layers, respectively, and these insulating layers are formed with the contact holes 10, 14-1, 14-2 and 15-1 to 15-4.

On the memory cell thus constructed, signal lines 16 represented by right-upward solid hatching for connecting the input/output buffer region 3A to the internal gate region (logic circuit) and/or to the sections of the input/output buffer regions 3B, 3D abutted against the memory region (FIGS. 1 and 2) are formed. Each of the signal line 16 is made of aluminum of third level and to the entire bottom of the line 16 above the macrocell region including the memory and the input and output selection circuits an inter-ply insulating layer 26 represented by left-upward dot hatching is attached so that each line 16 is electrically isolated at its part on the macrocell region. The signal line 16 represented in FIG. 5 is formed in the vicinity of the center line Y—Y and extends around peripheries of the contact holes 14-1 and 14-2. Such path of the signal line 16 around the contact holes is selected to by-pass a step portion 18. That is, the each of the step portions 18 has a step of about 1.5 $\mu$m which is a sum of steps between the poly silicon film 9-1, 9-2 and the first level metal wiring layer 13-1, 13-2, and the signal line 16 of the third level metal wiring layer may be broken if it is provided on such large step. Although this problem may be solved by arranging the edge of the first level metal wiring layer 13-1, 13-2 sufficiently spaced apart from the edge of the poly silicon film 9-1, 9-2, this solution results in adverse effect on high density integration.

The fact that there is no second level metal wiring layer in immediately below the third level metal wiring layer, i.e., the signal line 16, further provides an effective protection against breakage of the signal line. These are reasons why the digit lines Dj and $\overline{Dj}$ are provided on the main (vertical) portion of the poly silicon films 9-1 and 9-2, respectively.

The density of element in the macrocell region 5 is highest in the memory cell array portion of the memory 51 and lower in the peripheral portion of the memory 51 and in the selection circuits 52 and 53. Therefore, it is possible to arrange wiring or wirings on any portion of the macrocell region provided that it is possible to provide the third layer metal wiring on the memory cell.

In this embodiment, a portion of the wiring connecting the internal gate set 2 to the input and output buffer sets, i.e., a portion of each the buffer sets 3A, 3B and 3D, is provided above the macro 5. This can be realized by selecting construction of the memory cell, with which the effective area rate can be improved further.

It has been found that, with the present construction, a 72 Kbits CMOS SRAM in the macro region and 90K gates in the internal gate region can be mounted on a 15 mm $\times$ 15 mm semiconductor chip 1, with the internal gate set 2 being of a Sea-Of-Gates-Array (wholly formed and charged gate array) containing BiCMOS gates of 0.8 $\mu$m rule. Further, the area occupied by the memory 51 constituting the macro and the test circuit including the input selection circuit 52 and the output selection circuit 53 is about 12.8 mm $\times$ 5.0 mm. This is remarkable improvement of the conventional technique by which CMOS SRAM of at most 50 Kbits can be mounted on the same area. The area occupied by the internal gate set was about 12.4 mm $\times$ 7.6 mm.

Although it has been described that the macro is disposed between the input and output buffer set 3A and the internal gate set 2 arranged along the side 1C of the chip, another macro may be disposed between the internal gate set 2 and the input and output buffer set 3C.

As described hereinbefore, according to the present invention in which macro or macros of a composite type gate array semiconductor integrated circuit device are arranged around the internal gate set and connecting points in automatical wiring design between the internal gate set and the input and output buffer set are positioned in a boarder region between the internal gate set and the macro or macros, an automatic wiring region for connection between the input and output buffer set and the internal gate set is removed, so that the effective semiconductor chip area ratio, the wiring rate and the effective number of gates are improved.

Although the invention has been described with reference to a specific embodiment, this description is not meant to be construed in a limiting sense. Various modifications of the disclosed embodiment, as other embodiments of the invention, will become apparent to persons skilled in the art upon reference to the description of the invention. It is therefore contemplated that the appended claims will cover any modifications or embodiments as fall within the true scope of the invention.

What is claimed is:

1. A gate array semiconductor integrated circuit device comprising:
   a semiconductor chip having a quadrilateral plan shape peripherally enclosed by first, second, third and fourth straight edge lines;
   a first input/output buffer region formed on a first peripheral portion of said semiconductor chip and along said first straight edge line;
   a second input/output buffer region formed on a second peripheral portion of said semiconductor chip and along said second straight edge line, said second input/output buffer region being composed of a first section and a second section;
   a third input/output buffer region formed on a third peripheral portion of said semiconductor chip and along said third straight edge line;
   a fourth input/output buffer region formed on a fourth peripheral portion of said semiconductor chip and along said fourth straight edge line, said fourth input/output buffer region being composed of a first section and a second section;
   a plurality of input/output buffers formed in each of said first to fourth input/output buffer regions, respectively;
   a plurality of bonding pads formed between each of said first to fourth straight edge lines and said first to fourth input/output buffer regions, respectively;
   a macrocell region formed on a first central portion of said semiconductor chip, and attached to said first input/output buffer region, to said first section of said second input/output buffer region and to said first section of said fourth input/output buffer region;
   an internal gate region formed on a second central portion of said semiconductor chip, and adjacent to said macrocell region along a boundary line, to said third input/output buffer region, to said second section of said second input/output buffer region and to said second section of said fourth input/output buffer region;

first signal wiring layers, each of said first signal wiring layers connecting said internal gate region and said input/output buffer which is formed on said first input/output buffer region, crossing over said boundary line, formed on said macrocell region and isolated from said macrocell region;

second signal wiring layers, each of said second signal wiring layers connecting said internal gate region and said input/output buffer which is formed on said first section of said second input/output buffer region, crossing over said boundary line, formed on said macrocell region and isolated from said macrocell region; and third signal wiring layers, each of said third signal wiring layers connecting said internal gate region and said input/output buffer which is formed on said first section of said fourth input/output buffer region, crossing over said boundary line, formed on said macrocell region and isolated from said macrocell region.

2. A gate array semiconductor integrated circuit device of claim 1, in which said macrocell region is a memory region.

3. A gate array semiconductor integrated circuit of claim 2, in which said memory region includes polycrystalline silicon wiring layers, first metallic wiring layers made of a first level metal layer and second metallic wiring layers made of a second level metal layer, and said wiring layers connecting said input/output buffer region and said internal gate region are made of a third level metal layer.

4. A gate array semiconductor integrated circuit of claim 3, in which said first, second and third metal layers are aluminum layers.

5. A gate array semiconductor integrated circuit device comprising:
   a semiconductor chip having a quadrilateral plan shape peripherally enclosed by first, second, third and fourth straight edge lines;
   a first input/output buffer region formed on a first peripheral portion of said semiconductor chip and along said first straight edge line;
   a second input/output buffer region formed on a second peripheral portion of said semiconductor chip and along said second straight edge line, said second input/output buffer region being composed of a first section and a second section;
   a third input/output buffer region formed on a third peripheral portion of said semiconductor chip and along said third straight edge line;
   a fourth input/output buffer region formed on a fourth peripheral portion of said semiconductor chip and along said fourth straight edge line, said fourth input/output buffer region being composed of a first section and a second section;
   a plurality of input/output buffers formed in each of said first to fourth input/output buffer regions, respectively;
   a first group of bonding pads formed between said first straight edge line and said first input/output buffer region;
   a second group of bonding pads formed between said second straight edge line and said second input/output buffer region, said second group of bonding pads including test output terminals for outputting test output signals;
   a third group of bonding pads formed between said third straight edge line and said third input/output buffer region;
   a fourth group of bonding pads formed between said fourth straight edge line and said fourth input/output buffer region, said fourth group of bonding pads including test input terminals for inputting test input signals;
   a macrocell region formed on a first central portion of said semiconductor chip, and attached to said first input/output buffer region, to said first section of said second input/output buffer region and to said first section of said fourth input/output buffer region;
   an internal gate region formed on a second central portion of said semiconductor chip, and adjacent to said macrocell region along a boundary line, to said third input/output buffer region, to said second section of said second input/output buffer region and to said second section of said fourth input/output buffer region;
   a memory array formed in said macrocell region;
   an input selection circuit formed in said macrocell region, and connected to said test input terminals through said input/output buffers formed in said first section of said fourth input/output buffer region, to said internal gate region and to said memory array for selecting one of the output signals from said internal gate region and said test input signals supplied from said test input terminals and for sending said selected signals to said memory array as address signals or input data signals;
   an output selection circuit formed in said macrocell region, and connected to said test output terminals through said input/output buffers formed in said first section of said second input/output buffer region, to said internal gate region and to said memory array for receiving output data signals from said memory array and for sending said received output data signals either to said internal gate region or to said test output terminals; and
   signal wiring layers, each of said first signal wiring layers connecting said internal gate region and said input/output buffer which is formed on said first input/output buffer region, crossing over said boundary line, formed on said macrocell region and isolated from said macrocell region.

6. A gate array semiconductor integrated circuit device of claim 5, in which said memory array includes polycrystalline silicon wiring layers, said device further comprising first metallic wiring layers made of a first level metal layer, and second metallic wiring layers made of a second level metal layer, and said signal wiring layers are made of a third level metal layer.

7. A gate array semiconductor integrated circuit device of claim 6, in which said first, second and third metallic wiring layers are aluminum layers.

8. A gate array semiconductor integrated circuit device having a multi-layers structure composed of polycrystalline silicon wiring layers, first metallic wiring layers made of a first level metal layer at a level which is higher than the level of said polycrystalline silicon wiring layers, second metallic wiring layers made of a second level metal layer at a level which is higher than the level of said first level metal layer, and third metallic wiring layers made of a third level metal layer which is at a level that is higher than said second level metal layer, said device comprising:

a semiconductor chip having a quadrilateral plan shape peripherally enclosed by first, second, third and fourth straight edge lines;

a first input/output buffer region formed on a first peripheral portion of said semiconductor chip and along said first straight edge line;

a second input/output buffer region formed on a second peripheral portion of said semiconductor chip and along said second straight edge line, said second input/output buffer region being composed of a first section and a second section;

a third input/output buffer region formed on a third peripheral portion of said semiconductor chip and along said third straight edge line;

a fourth input/output buffer region formed on a fourth peripheral portion of said semiconductor chip and along said fourth straight edge line, said fourth input/output buffer region being composed of a first section and a second section;

a plurality of input/output buffers formed in each of said first to fourth input/output buffer regions, respectively;

a plurality of bonding pads formed between each of said first to fourth straight edge lines and said first to fourth input/output buffer regions, respectively;

a macrocell region formed on a first central portion of said semiconductor chip, and attached to said first input/output buffer region, to said first section of said second input/output buffer region and to said first section of said fourth input/output buffer region;

an internal gate region formed on a second central portion of said semiconductor chip, and adjacent to said macrocell region along a boundary line, to said third input/output buffer region, to said second section of said second input/output buffer region and to said second section of said fourth input/output buffer region;

a memory array formed in said macrocell region, said memory array comprising word lines made of said polycrystalline silicon layer and extending in a first direction, pairs of digit lines made of said second level metal layer and extending in a second direction perpendicular to said first direction, a first power supply line for supplying a first power voltage made of said first level metal layer and extending in said first direction, second power supply lines for supplying a second power voltage made of said second level metal layer and extending in said second direction, and memory cells of SRAM type coupled to said word lines, to said pairs of digit lines and to said first and second power supply lines, each of said memory cells including a first P-channel type field effect transistor having a source region, a drain region and gate electrode, a first N-channel type field effect transistor having a source region, a drain region and a gate electrode, a second P-channel type field effect transistor having a source region, a drain region and a gate electrode, a second N-channel type field effect transistor having a source region, a drain region and a gate electrode, a first conductive layer made of said polycrystalline silicon layer and having a main portion extending in said first direction under one of said pair of digit lines for connecting said gate electrode of said first P-channel type transistor and said gate electrode of said first N-channel type transistor and a branch portion extending from a part of said main portion in said second direction to form a first contact part, a second conductive layer made of said polycrystalline silicon layer and having a main portion extending in said first direction under the other of said pair of digit lines for connecting said gate electrode of said second P-channel type transistor and said gate electrode of said second N-channel type transistor and a branch portion extending from a part of said main portion in said second direction to form a second contact part, a third conductive layer made of said first level metal layer and extending in said first direction for connecting one of said source and drain regions of said first P-channel type transistor and one of said source and drain regions of said first N-channel type transistor, said third conductive layer being connected to said branch portion of said second conductive layer at said second contact part, and a fourth conductive layer made of said first level metal layer and extending in said first direction for connecting one of said source and drain regions of said second P-channel type transistor and one of said source and drain regions of said second N-channel type transistor, said fourth conductive layer being connected to said branch portion of said first conductive layer at said first contact part; and signal wiring layers, each of said signal wiring layers connecting said internal gate region and said input/output buffer region, crossing over said boundary line, extending on said macrocell region and isolated from said macrocell region, said signal wiring layers being made of said third level metal layer, and formed between and remote from said pair of digit lines such that any second metallic wiring layer made of said second level metal layer is absent under said signal wiring layers, and said signal wiring layers having circuitous routes around said first and second contact parts such that said first and second contact parts are absent under said signal wiring layers.

9. A gate array semiconductor integrated circuit device of claim 8, in which said first, second and third metallic wiring layers are aluminum layers.

* * * * *